United States Patent
Augur

(10) Patent No.: US 9,147,659 B1
(45) Date of Patent: Sep. 29, 2015

(54) BONDPAD ARRANGEMENT WITH REINFORCING STRUCTURES BETWEEN THE BONDPADS

(75) Inventor: Roderick Alan Augur, Hopewell Junction, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2038 days.

(21) Appl. No.: 11/317,021

(22) Filed: Dec. 27, 2005

(51) Int. Cl.
*H01L 31/00* (2006.01)
*H01L 23/532* (2006.01)

(52) U.S. Cl.
CPC ................................. *H01L 23/5329* (2013.01)

(58) Field of Classification Search
USPC ............ 257/459, 457, 773, E23.02, E23.153, 257/357, 207–209, 786, 536, 758; 307/303.1; 438/118, 125, 612, 614, 438/622, 666
See application file for complete search history.

(56) References Cited

U.S. PATENT DOCUMENTS

| | | | | |
|---|---|---|---|---|
| 5,334,866 A * | 8/1994 | Kubo | ............................. | 257/207 |
| 6,306,749 B1 * | 10/2001 | Lin | ............................... | 438/612 |
| 6,333,557 B1 * | 12/2001 | Sullivan | ....................... | 257/758 |
| 6,372,409 B1 * | 4/2002 | Yu | ................................. | 430/313 |
| 6,798,035 B1 * | 9/2004 | Low et al. | ..................... | 257/459 |
| 2004/0145045 A1 * | 7/2004 | Huang et al. | ................. | 257/700 |
| 2004/0212015 A1 * | 10/2004 | Huang et al. | ................. | 257/355 |
| 2005/0082577 A1 * | 4/2005 | Usui | ............................. | 257/211 |
| 2005/0087807 A1 * | 4/2005 | Righter | ........................ | 257/357 |
| 2005/0179110 A1 * | 8/2005 | Koubuchi et al. | ............. | 257/506 |

* cited by examiner

*Primary Examiner* — Dale E Page
(74) *Attorney, Agent, or Firm* — Volpe and Koenig, P.C.

(57) ABSTRACT

A metallization arrangement for an integrated circuit is provided with a plurality of pads, such as bondpads and a dielectric layer. These pads are separated from each other by gaps. Reinforcing structures between the gaps mechanically reinforce the dielectric layer and reduce the potential for cracking, especially when a low k dielectric layer is employed.

21 Claims, 3 Drawing Sheets

BONDPAD ARRANGEMENT WITH REINFORCING STRUCTURES BETWEEN THE BONDPADS

FIELD OF THE INVENTION

The present invention relates to the field of integrated circuit design, and more particularly, to bondpad designs for an interconnection structure.

BACKGROUND OF THE INVENTION

In efforts to improve the operating performance of a chip, low k dielectric materials have been increasingly investigated for use as replacements for dielectric materials with higher k values. Lowering the overall k value of the dielectric layer employed in the metal interconnect layers lowers the product of resistance×capacitance (RC) of the chip and improves its performance. There are a number of concerns in using low k materials, such as being more difficult to handle than traditionally employed higher k materials, such as oxides. Also, low k dielectric materials are readily damaged by techniques used to remove photoresist materials after the patterning of a layer. Another problem with low k dielectric materials, especially porous low k dielectric materials, is their relatively low mechanical strength. This can lead to a number of concerns in the final product, since a relatively low mechanical strength makes the low k materials susceptible to delamination and scratching during chemical mechanical polishing.

For off-chip connections, bondpads are employed in integrated circuits. The monolithic integrated circuits that are manufactured using dual damascene copper metallization and low k dielectric materials may suffer from cracking of the layers of low k materials above certain structures patterned on the integrated circuits. One of the worst case structures is considered to be large metal pads, such as bondpads, separated by a relatively small gap (5-10 μm wide). This risk of cracking is increased, particularly in the uppermost low k dielectric layer, if the edges of the pads are aligned vertically in successive layers, such as in bondpads. See, for example, FIG. 1 depicting a prior art arrangement.

FIG. 1 is a top view depicting an arrangement 10 in which a plurality of bondpads 12 are provided in a dielectric layer. In this example, the bondpads 12 are made of copper or copper alloy, and the dielectric layer is made of a low k dielectric material 14. The gaps 16 between the bondpads 12 are relatively narrow, such as between 5-10 μm wide.

In a side view, three metallization layers can be seen as forming part of the metallization of the integrated circuit. In the illustrated example of the prior art in FIG. 2, the metallization layers M1-M3 (reference numerals 18, 20, 22) are vertically connected by vias 24. Also, more metal layers may be involved.

Edges 26 of the pads 12 are vertically aligned, as seen in the side view of FIG. 2. Dielectric layers, made of a low k dielectric material, are prone to cracking. This is especially true for the uppermost low k dielectric layer in which the M3 metallization layer is provided.

The cracking of the dielectric material decreases the yield of integrated circuits made with copper metallization and low k dielectrics. It also prevents an increased number of interconnect levels to be built in low k dielectric material with conventional bondpad design. The constraint on the number of interconnect levels hampers improvements in performance of future integrated circuits.

SUMMARY OF THE INVENTION

There is a need for a pad design for an integrated circuit arrangement that reduces the risk of cracking in comparison to conventional pad design.

This and other needs are met by embodiments of the present invention in which an integrated circuit arrangement is provided comprising first conductive pads and a first metallization layer, with adjacent first conductive pads being separated from one another by a first gap. A first conductive structure is provided in the first gap between the adjacent first conductive pads. This first conductive structure is electrically unconnected to the first conductive pads.

The earlier stated needs are also met by other embodiments of the present invention which provide a metallization arrangement for an integrated circuit comprising a plurality of bondpads formed in a dielectric layer. These bondpads are separated from each other by gaps. The arrangement also comprises reinforcing structures between the gaps that mechanically reinforce the dielectric layer.

Other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of integrated circuits and the cracking of layers of low k materials in or above certain structures patterned on the integrated circuits. The present invention addresses and solves these problems, at least in part, by providing reinforcing structures, such as metal structures, into the gaps between pads. The reinforcing structure acts as mechanical stitches between adjacent pads, but does not electrically connect these pads. In certain embodiments, the stitches extend into recesses formed in the perimeter of the pads. The mechanical stitching reinforces the material in the gaps and reduces the potential for cracking, particularly in the uppermost low k dielectric layer.

Figure 1:
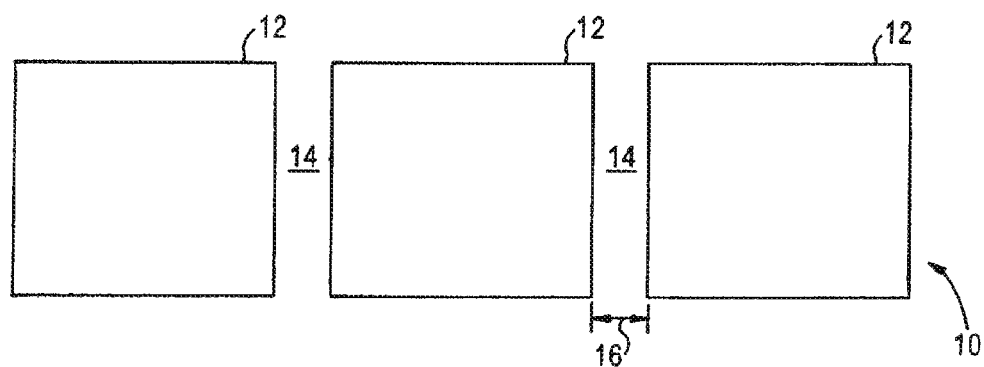
FIG. 1 is a top view of a metallization arrangement formed in accordance with prior art methodologies.
Figure 2:
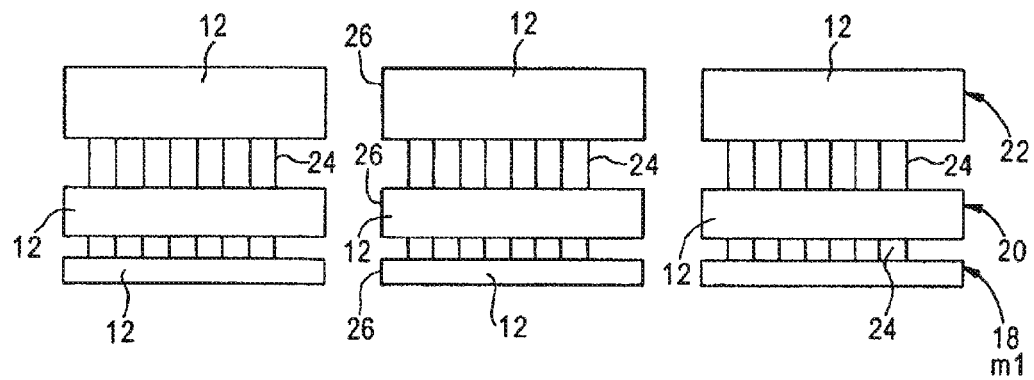
FIG. 2 depicts the prior art metallization arrangement of FIG. 1 in a cross-sectional side view.
Figure 3:
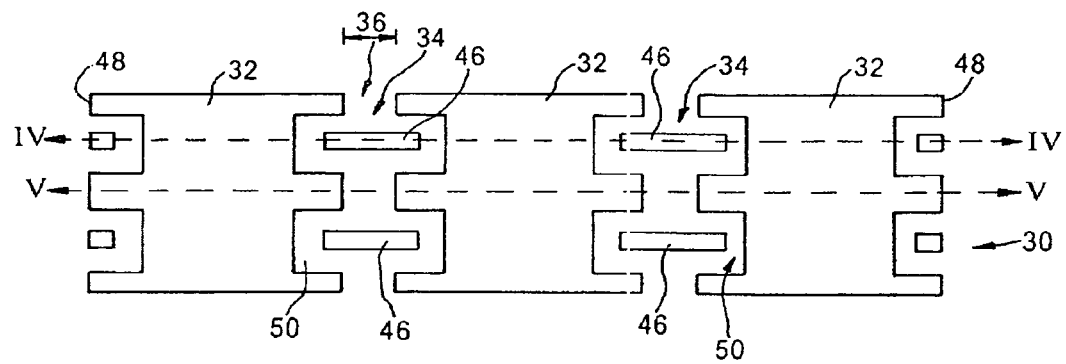
FIG. 3 is a top view of a metallization arrangement for an integrated circuit constructed in accordance with embodiments of the present invention.

FIG. 3 is a top view of an embodiment of a metallization arrangement constructed in accordance with embodiments of the present invention. The metallization arrangement 30, as seen in the top view of FIG. 3, contains a number of bondpads 32 or other conductive structures. The bondpads 32 (or "conductive pads 32") are separated by gaps 34 in the horizontal dimension. The gaps, for example, may be relatively small, such as between 5-10 μm wide, although the invention is not limited in this regard. From the top view, the sides 48 of the bondpads 32 can be seen to contain recesses 50 that extend towards the centers of the bondpads 32. The recesses are between about 1 to about 20 µm deep in certain embodiments, and in other embodiments, about 5 to about 10 µm deep.

The top view of FIG. 3 depicts a plurality of reinforcing structures 46 that are provided in the gaps 34 between the bondpads 32. These reinforcing structures 46 extend into the recesses 50. As an example, the reinforcing structures 46 may extend up to about 10 µm into the recesses, although other distances are possible without parting from the scope of the invention.

Figure 6:
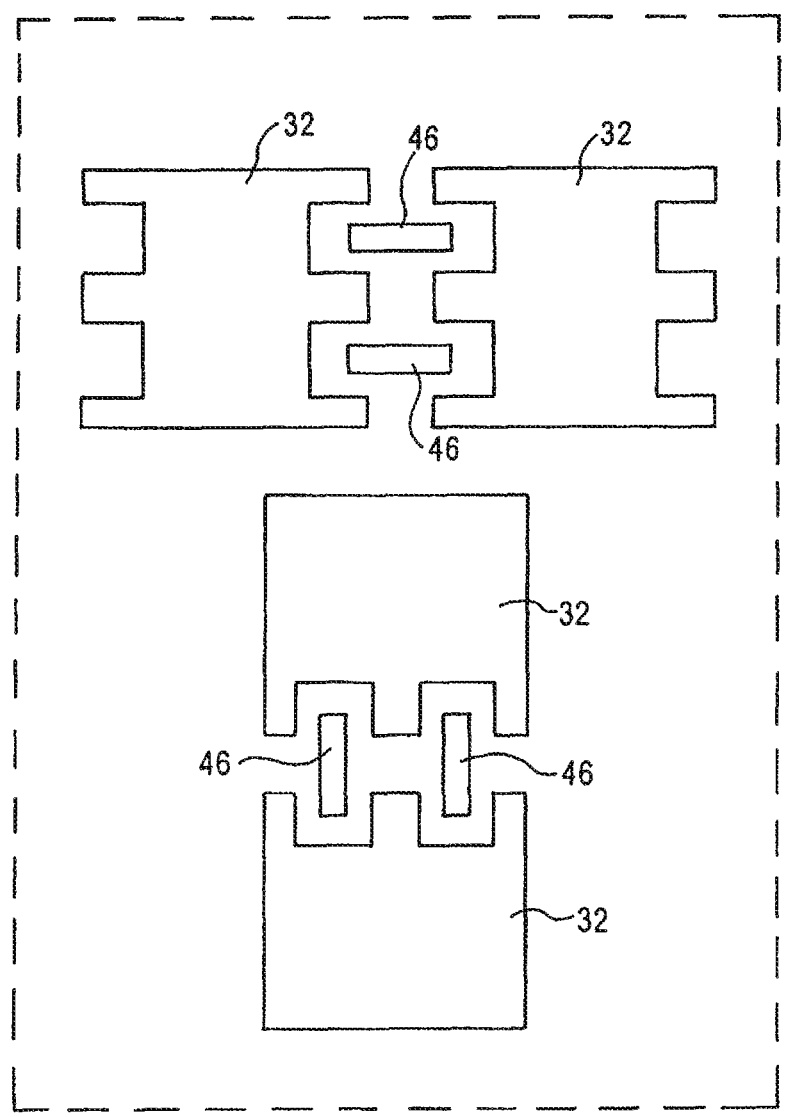
FIG. 6 is a top view of an alternate embodiment of the present invention.

The reinforcing structures 46 in FIG. 3 are aligned in a first direction. In other words, the reinforcing structures 46 are all aligned along the same axis or a parallel axis. In other embodiments, such as that shown in FIG. 6, some reinforcing structures are aligned in a first direction and some reinforcing structures 46 are aligned in a second direction orthogonal to the first direction. The arrangement of the reinforcing structures along orthogonal axes or parallel axes may depend on the arrangement of the bondpads 32.

The reinforcing structures 46 may be conductive structures, but are not electrically connected to the bondpads 32 in certain embodiments of the present invention. The reinforcing structures 46 serve as a mechanical stitching to reinforce the material in the gaps 34 and reduce the potential for cracking. Such cracking is especially possible in the uppermost dielectric layer, which may be made of a low k dielectric material, for example. Where the edges of pads are aligned vertically in successive layers, such as in bondpads, the risk of cracking is increased, particularly in the uppermost low k dielectric layer. Hence, the present invention is especially advantageous where the bondpads are aligned vertically.

Figure 4:
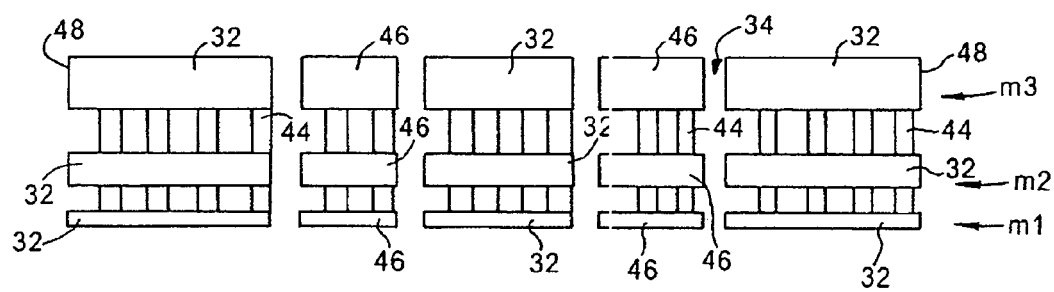
FIG. 4 depicts a cross-sectional side view of the arrangement of FIG. 3, taken along line IV-IV.
Figure 5:
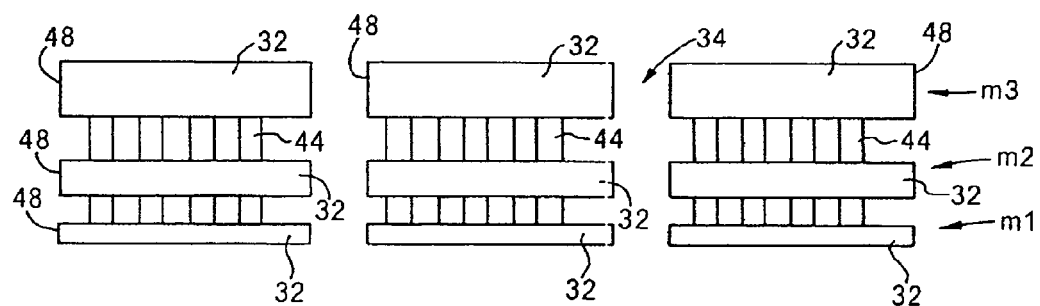
FIG. 5 is a cross-sectional side view of the arrangement of FIG. 3, taken along line V-V.

FIG. 4 is a cross-sectional view taken along line IV-IV in FIG. 3, while FIG. 5 is a cross-sectional view taken along line V-V in FIG. 3. The different metallization layers are referenced by M1, M2 and M3. The number of metallization layers is exemplary only, as in practice, more metallization layers may be involved. The three metallization layers M1-M3 are connected by vias 44. Dielectric material, such as low k dielectric material, fills the gaps between the metallization layers M1-M3 and between the bondpads 32 and the reinforcing structures 46.

As seen in FIG. 4, a plurality of reinforcing structures 46 may be provided in a vertically aligned arrangement. Hence, a reinforcing structure 46 is provided in metallization layer M1. A second reinforcing structure 46 is provided in metallization layer M2, and a third reinforcing structure 46 is provided in metallization layer M3. In the illustrated embodiment of FIG. 4, reinforcing structures 46 are connected by vias 44. However, the reinforcing structure 46 in successive layers are not connected by vias in certain embodiments of the invention. As can be seen in FIG. 4, the reinforcing structures 46 are not electrically connected to the bondpads 32 in the different metallization layers M1-M3. Instead, the mechanical reinforcing provided by the reinforcing structures 46 act to reduce the potential for cracking, particularly in the uppermost dielectric layer in which the metallization layer M3 is provided.

With the arrangement of the present invention, a reduced cracking of the uppermost low k dielectric layer provides for increased yield of integrated circuits made with copper metallization and low k dielectric material. It allows more interconnect levels to be constructed in low k dielectric material than with conventional bondpad design, thereby making possible improved performance of integrated circuits.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An integrated circuit arrangement, comprising:
    first bondpads in a first metallization layer, the first metallization layer being a topmost metallization layer in contact with a dielectric layer made of a low-k dielectric material, with adjacent first bondpads being separated from one another by a first gap, at least one of the first bondpads having a recess formed in at least one of its sides; and
    at least one first conductive structure in the first gap between the adjacent first bondpads, the at least one first conductive structure being electrically insulated from all of the first bondpads.

2. The arrangement of claim 1, further comprising second bondpads in a second metallization layer, with adjacent second bondpads being separated from one another by a second gap, the first and second bondpads in the first and second metallization layers being vertically aligned with each other; and
    at least one second conductive structure in the second gap between the adjacent second bondpads, the at least one second conductive structure being electrically insulated from the second bondpads and vertically aligned with the first conductive structure.

3. The arrangement of claim 2, wherein at least one of the second bondpads has a second recess formed in at least one of its sides.

4. The arrangement of claim 1, wherein the at least one first conductive structure extends into the recess.

5. The arrangement of claim 2, further comprising vias connected between the at least one first and the at least one second conductive structures.

6. The arrangement of claim 1, wherein the at least one first conductive structure extends between about 1 to about 20 micrometers into the recess.

7. The arrangement of claim 1, wherein the at least one first conductive structure extends between about 5 to about 10 micrometers into the recess.

8. The arrangement of claim 1, wherein all of the first conductive structures are aligned along a first axis or another axis parallel to the first axis.

9. The arrangement of claim 2, further comprising a low k dielectric layer between the first and second metallization layers.

10. A metallization arrangement for an integrated circuit, comprising:
    a plurality of bondpads in a dielectric layer, the bondpads being separated from each other by gaps, the bondpads formed in a topmost metallization layer in contact with a dielectric layer made of a low-k dielectric material; and
    reinforcing structures within the gaps that mechanically reinforce the dielectric layer;
    at least one of the bondpads having at least one recess formed in its perimeter;
    wherein the reinforcing structures are electrically insulated from all of the bondpads.

11. The arrangement of claim 10, wherein at least one of the reinforcing structures extends into the recess of an adjacent one of the bondpads.

12. The arrangement of claim 10, wherein at least one of the reinforcing structures extends approximately 10 micrometers beyond the perimeter of a bondpad into the recess.

13. The arrangement of claim 10, wherein the reinforcing structures are aligned in a first direction.

14. The arrangement of claim 10, wherein the reinforcing structures are metal and are electrically insulated from the bondpads.

15. The arrangement of claim 10, further comprising a second plurality of bondpads in a second dielectric layer, with second reinforcing structures between gaps in the second plurality of bondpads mechanically reinforcing the second dielectric layer.

16. The arrangement of claim 15, wherein the plurality of bondpads and the second plurality of bondpads are vertically aligned with one another, and the reinforcing structures and the second reinforcing structures are vertically aligned with one another.

17. The arrangement of claim 3, wherein the second conductive structure extends into the second recess.

18. The arrangement of claim 3, wherein the at least one second conductive structure extends between about 1 to about 20 micrometers into the second recess.

19. The arrangement of claim 3, wherein the at least one second conductive structure extends between about 5 to about 10 micrometers into the second recess.

20. The arrangement of claim 2, wherein all of the second conductive structures are aligned along a first axis or another axis parallel to the first axis.

21. The arrangement of claim 16, wherein at least one of the reinforcing structures is not connected by a via to the second reinforcing structure vertically aligned with the at least one of the reinforcing structures.

\* \* \* \* \*